(12) United States Patent
Nishihara

(10) Patent No.: US 11,785,175 B2
(45) Date of Patent: Oct. 10, 2023

(54) SOLID-STATE IMAGING APPARATUS, RADIATION DETECTOR, AND RADIATION MEASUREMENT SYSTEM

(71) Applicant: SONY SEMICONDUCTOR SOLUTIONS CORPORATION, Kanagawa (JP)

(72) Inventor: Toshiyuki Nishihara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 221 days.

(21) Appl. No.: 17/250,795

(22) PCT Filed: Sep. 11, 2019

(86) PCT No.: PCT/JP2019/035655
§ 371 (c)(1),
(2) Date: Mar. 4, 2021

(87) PCT Pub. No.: WO2020/054756
PCT Pub. Date: Mar. 19, 2020

(65) Prior Publication Data
US 2021/0352225 A1    Nov. 11, 2021

(30) Foreign Application Priority Data
Sep. 14, 2018  (JP) .................................. 2018-173063

(51) Int. Cl.
*H04N 5/32*    (2023.01)
*G01T 1/202*   (2006.01)
*H01L 27/146*  (2006.01)

(52) U.S. Cl.
CPC .............. *H04N 5/32* (2013.01); *G01T 1/202* (2013.01); *H01L 27/14609* (2013.01); *H01L 27/14623* (2013.01); *H01L 27/14658* (2013.01)

(58) Field of Classification Search
None
See application file for complete search history.

(56) References Cited

U.S. PATENT DOCUMENTS

| 6,333,502 B1* | 12/2001 | Sumita | G01T 1/202 |
| | | | 250/363.01 |
| 2002/0190215 A1* | 12/2002 | Tashiro | H04N 5/3559 |
| | | | 348/E5.088 |
| 2008/0252762 A1* | 10/2008 | Iwamoto | H04N 5/35518 |
| | | | 348/301 |

(Continued)

FOREIGN PATENT DOCUMENTS

| CN | 1387264 A | 12/2002 |
| CN | 103875236 A | 6/2014 |

(Continued)

OTHER PUBLICATIONS

International Search Report and Written Opinion of PCT Application No. PCT/JP2019/035655, dated Nov. 26, 2019, 11 pages of ISRWO.

*Primary Examiner* — Edwin C Gunberg
(74) *Attorney, Agent, or Firm* — CHIP LAW GROUP

(57) ABSTRACT

A solid-state imaging apparatus includes a photoelectric conversion element, a transfer transistor, a reset transistor, an amplifier transistor, a converter circuit that converts an analog voltage appearing at a vertical signal line into a digital voltage value, a first signal line that is connected to the gate of the reset transistor, a second signal line that is connected to the gate of the transfer transistor, and a drive circuit that outputs to the first signal line a reset pulse for causing the reset transistor to discharge charge in a charge accumulation portion, and outputs to the second signal line (Continued)

a transfer pulse for causing the transfer transistor to transfer charge generated in the photoelectric conversion element to the charge accumulation portion. The drive circuit outputs the reset pulse to the first signal line, and then outputs the transfer pulse to the second signal line successively in two or more times.

20 Claims, 10 Drawing Sheets

(56) References Cited

U.S. PATENT DOCUMENTS

| | | | | |
|---|---|---|---|---|
| 2009/0050810 A1* | 2/2009 | Nagarkar | ............... | G01T 1/202 |
| | | | | 250/361 R |
| 2012/0312966 A1* | 12/2012 | Suzuki | ..................... | G01J 1/46 |
| | | | | 250/208.1 |
| 2014/0211058 A1* | 7/2014 | Nishihara | .............. | H04N 5/378 |
| | | | | 348/308 |

FOREIGN PATENT DOCUMENTS

| | | |
|---|---|---|
| EP | 1259066 A2 | 11/2002 |
| EP | 2770730 A1 | 8/2014 |
| JP | 2002-344809 A | 11/2002 |
| JP | 2008-263546 A | 10/2008 |
| JP | 2010-117344 A | 5/2010 |
| JP | 2013-12888 A | 1/2013 |
| JP | 2013-90139 A | 5/2013 |
| JP | 2016-136750 A | 7/2016 |
| WO | 2013/058147 A1 | 4/2013 |

* cited by examiner

SOLID-STATE IMAGING APPARATUS, RADIATION DETECTOR, AND RADIATION MEASUREMENT SYSTEM

CROSS REFERENCE TO RELATED APPLICATIONS

This application is a U.S. National Phase of International Patent Application No. PCT/JP2019/035655 filed on Sep. 11, 2019, which claims priority benefit of Japanese Patent Application No. JP 2018-173063 filed in the Japan Patent Office on Sep. 14, 2018. Each of the above-referenced applications is hereby incorporated herein by reference in its entirety.

FIELD

The present disclosure relates to a solid-state imaging apparatus, a radiation detector, and a radiation measurement system.

BACKGROUND

Radiation counting (photon counting) of counting the dose of radiation emitted into a detector while distinguishing individual energies in units of incident photons has been applied to a variety of fields such as a dosimeter and a gamma camera. One typical example thereof is a dosimeter in a wide sense represented by a survey meter. As the detector, a scintillator and a photomultiplier are commonly used, and the energy of radiation emitted into the detector and the number thereof are counted. In recent years, instead of the photomultiplier, a radiation detector using a solid-state imaging apparatus of a complementary metal oxide semiconductor (CMOS) type has been developed.

CITATION LIST

Patent Literature

Patent Literature 1: Japanese Patent Application Laid-open No. 2013-12888
Patent Literature 2: Japanese Patent Application Laid-open No. 2016-136750
Patent Literature 3: Japanese Patent Application Laid-open No. 2010-117344

SUMMARY

Technical Problem

Herein, in order to improve convenience of the radiation detector using the solid-state imaging apparatus of the complementary metal oxide semiconductor (CMOS) type, it is important to increase the frame rate. However, in the conventional solid-state imaging apparatus of the CMOS type, it is difficult to increase the frame rate because two samplings need to be performed for one readout due to correlated double sampling (CDS) processing for the purpose of noise removal.

In view of this, the present disclosure proposes a solid-state imaging apparatus, a radiation detector, and a radiation measurement system that enable the frame rate to be increased.

Solution to Problem

To solve the above-described problem, a solid-state imaging apparatus according to one aspect of the present disclosure comprises: a photoelectric conversion element that converts an incident photon into charge; a transfer transistor that transfers the charge generated in the photoelectric conversion element to a charge accumulation portion; a reset transistor that discharges the charge in the charge accumulation portion, an amplifier transistor that causes a voltage having a voltage value corresponding to the amount of the charge in the charge accumulation portion to appear at a vertical signal line; a converter circuit that is connected to the vertical signal line and converts an analog voltage appearing at the vertical signal line into a digital voltage value; a first signal line that is connected to a gate of the reset transistor; a second signal line that is connected to a gate of the transfer transistor; and a drive circuit that outputs to the first signal line a reset pulse for causing the reset transistor to discharge the charge in the charge accumulation portion, and outputs to the second signal line a transfer pulse for causing the transfer transistor to transfer the charge generated in the photoelectric conversion element to the charge accumulation portion, wherein the drive circuit outputs the reset pulse to the first signal line, and then outputs the transfer pulse to the second signal line successively in two or more times.

Advantageous Effects of Invention (Effect) With the solid-state imaging apparatus according to the aspect of the present disclosure, sampling of pixel signals can be performed successively in a plurality of times for one reset. In other words, in reading of a plurality of consecutive frames, during sampling of pixel signals for the second and subsequent times, reset of a unit pixel, for example, and auto zero, for example, of a comparator can be omitted. This allows the reset period to be omitted, and the frame rate can be increased accordingly.

DESCRIPTION OF EMBODIMENTS

One embodiment of the present disclosure will now be described in detail with reference to the drawings. In the following embodiments, like parts are designated by like reference signs, and thus duplicate description is omitted.

The present disclosure will be described in the order of items listed below.
1. First Embodiment
   1.1 General Outline of Solid-State Imaging Apparatus
   1.2 Schematic Configuration of Unit Pixel and AD Converter Circuit
      1.2.1 Schematic Configuration of Unit Pixel
      1.2.2 Schematic Configuration of AD Converter Circuit
   1.3 Example of Sampling Operation
      1.3.1 Example of Normal Sampling Operation
      1.3.2 Example of Sampling Operation according to First Embodiment
      1.3.3 Modification of Sampling Operation according to First Embodiment
   1.4 Functional Effects
2. Second Embodiment
   2.1 Schematic Configuration of Solid-State Imaging Apparatus, Unit Pixel, and AD Converter Circuit
   2.2 Example of Sampling Operation
   2.3 Functional Effects
3. Third Embodiment
   3.1 Radiation Measurement System
   3.2 Radiation Detector
   3.3 Configuration Example of Solid-State Imaging Apparatus
   3.4 Cross-Section Structure Example of Unit Pixel
   3.5 Functional Effects 1. First Embodiment A first embodiment will be described first in detail with reference to the drawings.

1.1 General Outline of Solid-State Imaging Apparatus

Figure 1:
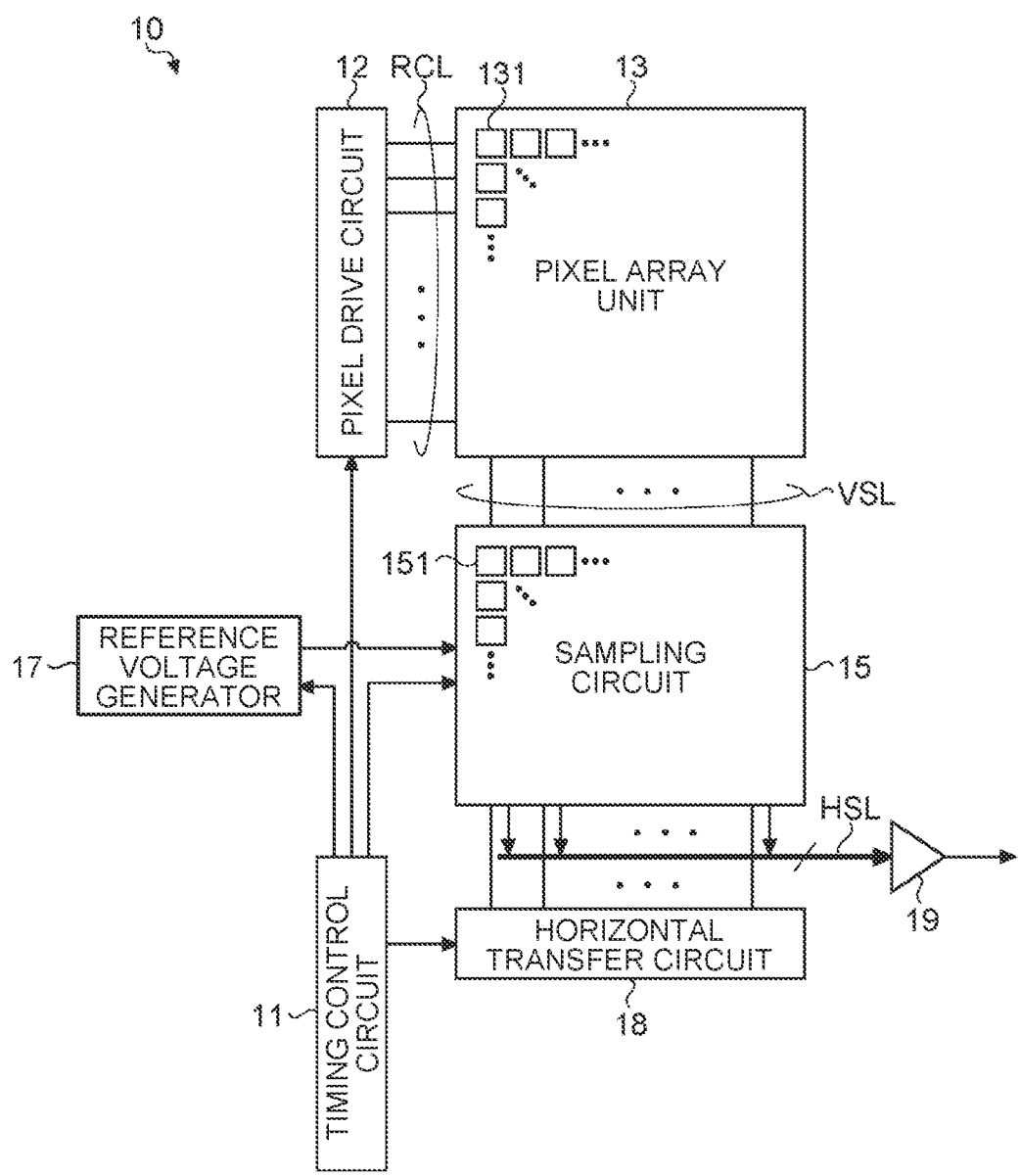
FIG. 1 is a schematic configuration diagram of a CMOS solid-state imaging apparatus according to an embodiment.

FIG. 1 is a schematic configuration diagram of a CMOS solid-state imaging apparatus (hereinafter, simply called "solid-state imaging element") according to the first embodiment. As illustrated in FIG. 1, a solid-state imaging apparatus 10 according to the present embodiment includes a pixel array unit 13, a sampling circuit 15, a reference voltage generator 17, and an output circuit 19.

Outside the pixel array unit 13, a drive controller for reading an analog pixel signal from each of unit pixels 131 sequentially to output the signals as digital image data is provided. This drive controller may include a horizontal transfer circuit 18, a pixel drive circuit 12, and a timing control circuit 11.

The pixel array unit 13 includes a plurality of unit pixels 131 that are arranged in a row direction and a column direction in a two-dimensional matrix. In FIG. 1, for simplicity of description, rows and columns in the pixel array unit 13 are partially omitted. However, for example, several tens to several thousands of unit pixels 131 can be arranged in each row and in each column.

The respective unit pixels 131 are connected to the pixel drive circuit 12 via control lines RCL for selecting pixels, and are also connected to AD converter circuits 151 described later via vertical signal lines VSL on a one-to-one basis. Herein, the control lines RCL refer to wires in general that extend from the pixel drive circuit 12 into the respective unit pixels 131. For example, the control lines RCL may include control lines for propagating various types of pulse signals (e.g., pixel reset pulses, transfer pulses, drain-line control pulses) for driving the unit pixels 131.

The sampling circuit 15 includes a plurality of analog-to-digital (AD) converter circuits 151 that are provided to the respective unit pixels 131 on a one-to-one basis. In FIG. 1, a configuration is illustrated in which the AD converter circuits 151 are arranged in the row direction and in the column direction in the two-dimensional matrix. However, the arrangement thereof is not limited to this configuration.

Each AD converter circuit 151, though a specific example thereof will be described later, performs AD conversion to convert separately each of, for example, a reset level that is a reference level of a pixel signal and a signal level depending on the amount of received light into digital data. The AD converter circuit 151 also performs subtraction processing (corresponding to correlated double sampling (CDS) processing) to acquire a digital pixel signal of a signal component depending on the amount of received light. In this CDS processing, processing of calculating a difference between an AD conversion result of a reset level and an AD conversion result of a pixel signal is performed. Furthermore, in the present embodiment, CDS processing of calculating a difference between an AD conversion result of the previous pixel signal and an AD conversion result of the subsequent pixel signal is also performed. The AD converter circuit 151 may be an AD converter circuit of a single slope type, for example. However, the AD converter circuit 151 is not limited to this, and may be an AD converter circuit of a successive approximation register (SAR) type.

The reference voltage generator 17 supplies to the sampling circuit 15 a reference voltage REF for converting an analog pixel signal (analog voltage) read from each unit pixel 131 via the corresponding vertical signal line VSL into a digital pixel signal. For example, the reference voltage generator 17 outputs a reference voltage REF having a sawtooth (also called "ramp-shaped") waveform in which the voltage rises or falls in a linear or a stepwise manner. At this time, for example, when the solid-state imaging apparatus 10 is used as a radiation detector, the level difference between the maximum voltage level of the reference voltage REF and the minimum voltage level thereof may be set smaller. By this setting, the dynamic range for pixel signals can be reduced, whereby the gain can be increased.

If the AD converter circuits 151 are of a successive approximation register type, the reference voltage generator 17 outputs a reference voltage REF having a constant voltage value. In this case, each AD converter circuit 151 divides the reference voltage REF that is a constant voltage to generate a plurality of reference voltages to be used for successive approximation.

The timing control circuit 11 outputs, for example, a pulse signal for providing an internal clock needed for operation of each part and a timing for the part to start the operation. The timing control circuit 11 receives data on a master clock and instructions of operation modes or the like from outside, and outputs data including information on the solid-state imaging apparatus 10.

For example, the timing control circuit 11 outputs to the pixel drive circuit 12 a pulse signal for providing a timing for reading a pixel signal from each unit pixel 131. The timing control circuit 11 also outputs to the horizontal transfer circuit 18 a column address signal for sequentially reading pixel signals (digital voltage values) of signal components that have been AD converted by the AD converter circuits 151 for each column from the sampling circuit 15.

The timing control circuit 11 provides as an internal clock a clock having the same frequency as that of the master clock input from outside, a clock having a frequency scaled down to a half thereof, and a low-speed clock having a frequency scaled down to a half thereof or lower, for example, to the respective parts in the solid-state imaging apparatus 10, for example, to the horizontal transfer circuit 18, the pixel drive circuit 12, and the sampling circuit 15. Hereinafter, a clock scaled down to a half and a clock in general having a frequency lower than this are all referred to as low-speed clocks.

The pixel drive circuit 12 controls reading of pixel signals from the respective unit pixels 131 of the pixel array unit 13. In the present embodiment, because one AD converter circuit 151 is provided to each unit pixel 131, the pixel drive circuit 12 can control reading of pixel signals simultaneously for all unit pixels 131. In this case, in response to input of pulse signals from the timing control circuit 11, the pixel drive circuit 12 appropriately outputs pixel reset pulses, transfer pulses, and drain-line control pulses, for example, to the control lines RCL connected to the respective unit pixels 131, thereby performing reset and reading of pixel signals for all unit pixels 131. However, the reading is not limited to these reading operations, and various modifications may be made such as performing reading for each column.

Based on column address signals input from the timing control circuit 11, the horizontal transfer circuit 18 performs shift operation (scanning) of reading digital pixel signals from the respective AD converter circuits 151 of reading columns specified by the column address signals to the corresponding horizontal signal lines HSL.

The output circuit 19 outputs the digital pixel signals read by the horizontal transfer circuit 18 as image data to the outside.

In the preceding or subsequent stage of the sampling circuit 15, for example, an auto gain control (AGC) circuit having a signal amplifying function may be provided if necessary.

The solid-state imaging apparatus 10 may be provided with one example of a high-speed clock generator that is a clock converter configured to generate pulses having a clock frequency higher than an input clock frequency. In this case, the timing control circuit 11 may generate the internal clock based on an input clock (e.g., the master clock) input from outside and a high-speed clock generated in the clock converter.

1.2 Schematic Configuration of Unit Pixel and AD Converter Circuit

Figure 2:
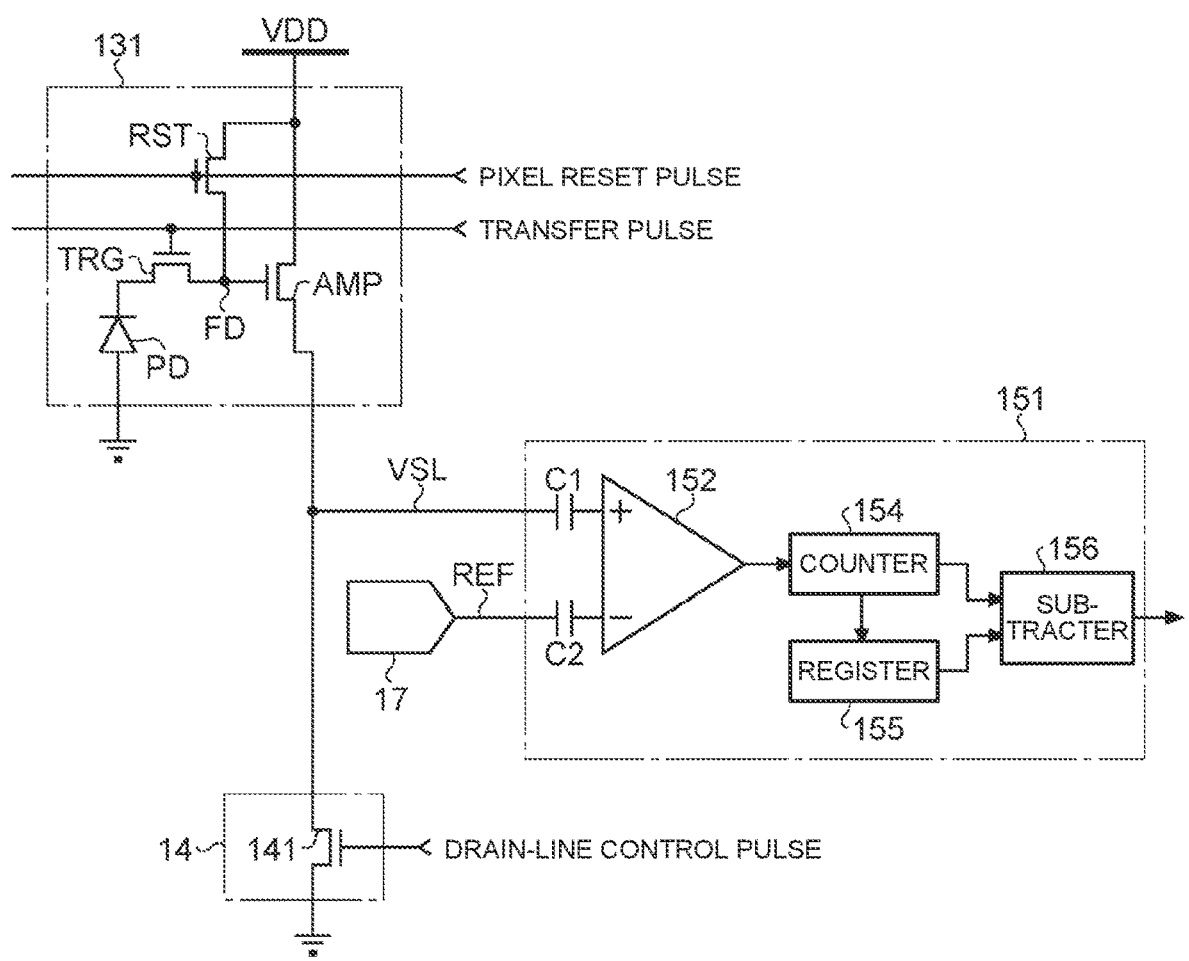
FIG. 2 is a circuit diagram illustrating a schematic configuration example of a unit pixel and an AD converter circuit according to the embodiment.

The following describes a configuration example of each unit pixel 131 and the corresponding AD converter circuit 151 in detail with reference to the drawings. FIG. 2 is a circuit diagram illustrating a schematic configuration example of the unit pixel and the AD converter circuit according to the present embodiment. Herein, an example will be described in which the AD converter circuit 151 is of a single slope type. However, as described above, the type thereof is not limited to the single slope type, and the AD converter circuit of a successive approximation register type, for example, may be used.

1.2.1 Schematic Configuration of Unit Pixel

As illustrated in FIG. 2, the unit pixel 131 includes a photodiode (photoelectric conversion element) PD, a floating diffusion (charge accumulation portion) FD, a transfer transistor TRG, an amplifier transistor AMP, and a reset transistor RST. For the transfer transistor TRG, the amplifier transistor AMP, and the reset transistor RST, for example, n-type metal-oxide semiconductor (MOS) transistors may be used.

The photodiode PD converts an incident photon into charge by photoelectric conversion. The cathode of this photodiode PD is connected to the source of the transfer transistor TRG, and the anode thereof is grounded. The photodiode PD generates a pair of an electron and a hole from a photon incident on a semiconductor substrate of the unit pixel 131, and accumulates this electron in the cathode. The photodiode PD may be what is called an embedded-type photodiode the cathode of which is depleted completely when charge is discharged by reset.

The transfer transistor TRG transfers charge from the photodiode PD to the floating diffusion FD at the timing when a transfer pulse has been output from the pixel drive circuit 12. The gate of this transfer transistor TRG is connected to a control line RCL (second signal line) to which a transfer pulse is input from the pixel drive circuit 12, and the drain thereof is connected to the floating diffusion FD. The floating diffusion FD accumulates charge that has flown from the photodiode PD through the transfer transistor TRG, and generates an analog voltage corresponding to the amount of the accumulated charge. This voltage is applied to the gate of the amplifier transistor AMP.

The reset transistor RST pulls out the charge accumulated in the cathode of the photodiode PD and the floating diffusion FD toward the power supply voltage VDD for initialization. The gate of this reset transistor RST is connected to a control line RCL (first signal line) to which a pixel reset pulse is input from the pixel drive circuit 12, the drain thereof is connected to the power supply voltage VDD, and the source thereof is connected to the floating diffusion FD.

The pixel drive circuit 12 controls, for example, the reset transistor RST to an ON state, thereby pulling out electrons accumulated in the floating diffusion FD to the power supply voltage VDD to put the unit pixel 131 into a reset state (also called "dark state") before the charge is accumulated, that is, to initialize it to a state in which light is not yet incident thereto. The pixel drive circuit 12 can also pull out the charge accumulated in the cathode of the photodiode PD to the power supply voltage VDD by controlling the transfer transistor TRG together with the reset transistor RST to an ON state.

The amplifier transistor AMP is a transistor that amplifies a voltage applied to the gate thereof. The gate of this amplifier transistor AMP is connected to the floating diffusion FD, the drain thereof is connected to the power supply voltage VDD, and the source thereof is connected to the source of a load MOS transistor 141 included in a constant current circuit 14. As the load MOS transistor 141, for example, an n-type MOS transistor may be used. The gate of the load MOS transistor 141 is connected to a control line RCL to which a drain-line control pulse is input from the pixel drive circuit 12, and the drain thereof is grounded.

The amplifier transistor AMP and the load MOS transistor 141 of the constant current circuit 14 form a source follower circuit, and the vertical signal line VSL is connected to a connection portion between the source of the amplifier transistor AMP and the source of the load MOS transistor 141. With this configuration, the voltage of the floating diffusion FD is output to the vertical signal line VSL with a gain a little lower than one, for example.

1.2.2 Schematic Configuration of AD Converter Circuit

As illustrated in FIG. 2, the AD converter circuit 151 includes a comparator 152, a counter 154, a register (holding unit) 155, and a subtracter 156.

The non-inverting input terminal of the comparator 152 is connected to the vertical signal line VSL with a coupling capacitor C1 interposed therebetween. The inverting input terminal thereof is connected to the reference voltage generator 17 with a coupling capacitor C2 interposed therebetween. The comparator 152 compares an analog pixel signal input to the non-inverting input terminal with a ramp-shaped reference voltage REF input to the inverting input terminal, and inverts the output based on the comparison result.

In sampling of reset levels, the comparator 152 compares the potential of a reset level (also called "reset potential") input to the non-inverting input terminal with the ramp-shaped reference voltage REF input to the inverting input terminal, and outputs the result. For example, when the reference voltage REF has a ramp-shaped waveform in which the voltage gradually decreases, the comparator 152 outputs a Low-level comparison result if the reference voltage REF is higher than the reset level, and outputs a High-level comparison result if the reference voltage REF has become lower than the voltage of the pixel signal.

In sampling of pixel signals, the comparator 152 compares a pixel signal input to the non-inverting input terminal with the ramp-shaped reference voltage REF input to the inverting input terminal, and outputs the result. For example, when the reference voltage REF has a ramp-shaped waveform in which the voltage gradually decreases, the comparator 152 outputs the Low-level comparison result if the reference voltage REF is higher than the voltage of the pixel signal, and outputs the High-level comparison result if the reference voltage REF has become lower than the voltage of the pixel signal.

The comparator 152 may have an auto zero function of shorting the non-inverting input terminal and the inverting input terminal with an internal node thereof to achieve a balanced state.

The counter 154 counts a count value based on the comparison result output from the comparator 152. The count value thus counted is a digital value of the reset level or the pixel signal. Specifically, in the present embodiment, the comparator 152 and the counter 154 function as a converter that converts an analog voltage (the reset level or the pixel signal) appearing at the vertical signal line VSL into a digital pixel signal. The counter 154 may be an up counter or may be a down counter, for example.

To the counter 154, for example, from the timing control circuit 11, an initialization signal for resetting the count value and clock signals having a predetermined cycle (e.g., when the reference voltage REF has a stepwise waveform, the cycle is the same as a cycle at which the voltage changes) are input.

The counter 154 resets the count value to an initial value in response to input of an initialization signal, and then counts the number of clock signals that have been input until the reference signal REF exceeds the reset level. The count value when the reference signal REF has exceeded the reset level is a digital pixel signal representing the reset level. Subsequently, the counter 154 resets the count value to the initial value in response to input of an initialization signal, and then counts the number of clock signals that have been input until the reference signal REF exceeds the voltage of the pixel signal. The count value when the reference signal REF has exceeded the voltage of the pixel signal is a digital pixel signal representing the pixel signal.

The count value of the reset level and the count value of the pixel signal thus obtained are input to the register 155 and/or the subtracter 156 if necessary.

The subtracter 156 calculates a difference between the count value of the reset level or the pixel signal read from the register 155 and the count value of the pixel signal input from the counter 154, thereby generating a digital image signal of a signal component (CDS processing).

Digital image signals of the signal component thus generated are sequentially read with shift operation being performed by the horizontal transfer circuit 18, and are output as image data from the output circuit 19.

The comparator 152, the counter 154, the register 155, and the subtracter 156 may be provided to the same semiconductor chip, or at least some of these (e.g., the register 155 and the subtracter 156) may be provided to a semiconductor chip separate from that of the comparator 152.

1.3 Example of Sampling Operation

The following describes sampling operation in reading operation according to the present embodiment.

1.3.1 Example of Normal Sampling Operation

In the present embodiment, for one reset, the sampling of pixel signals is performed in a plurality of times in addition to the sampling of reset levels. To begin with, as a comparative example, normal sampling operation of performing one sampling of reset levels and one sampling of pixel signals for one reset will be described. The reset herein may be operation of pulling out charge of the floating diffusion FD to achieve an initialized state. In addition to this, the reset may include operation of pulling out charge accumulated in the cathode of the photodiode PD to achieve an initialized state and/or auto zero operation of shorting the two input terminals of the comparator 152 with the internal node thereof to achieve the balanced state.

Figure 3:
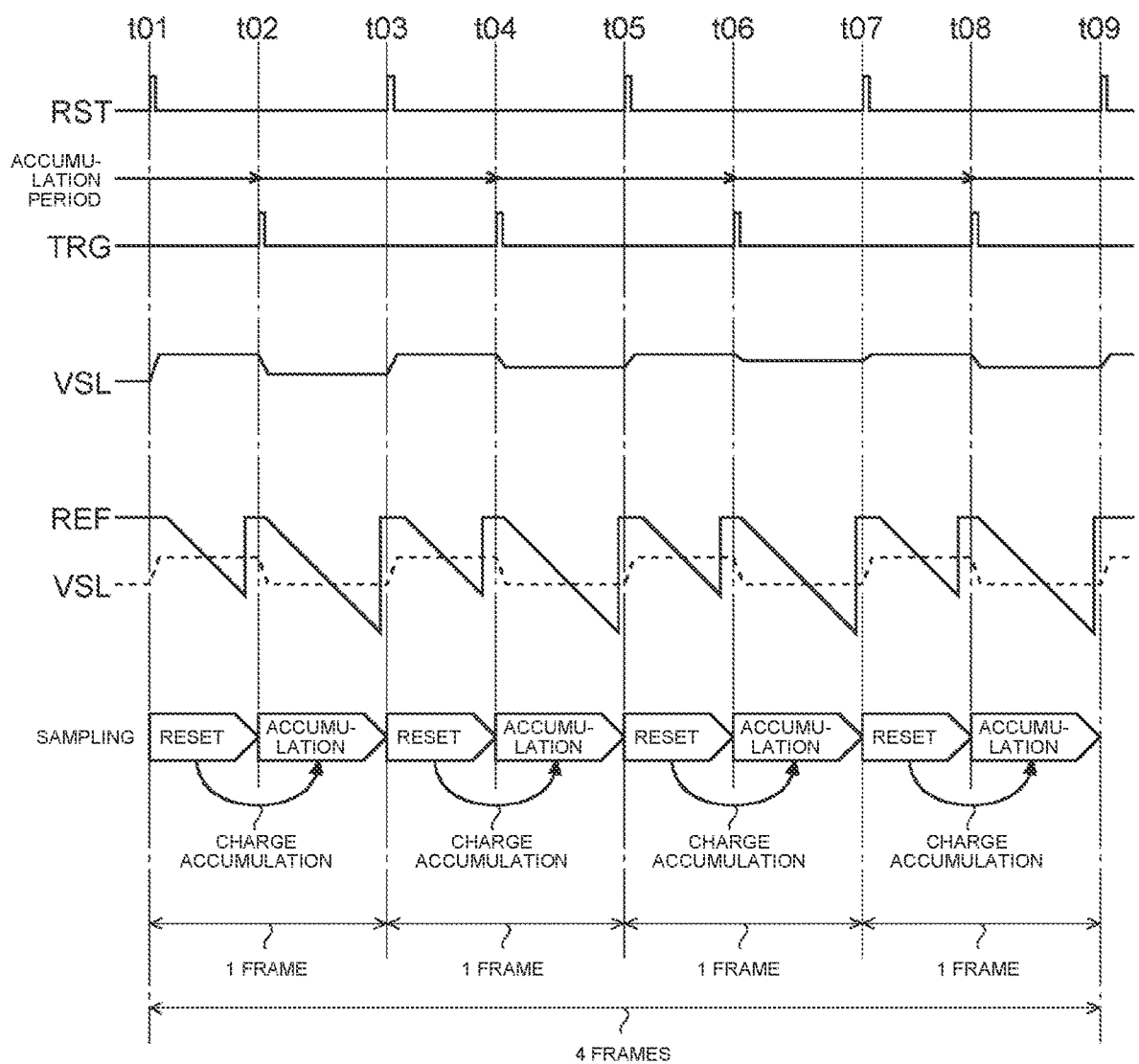
FIG. 3 is a waveform chart illustrating one example of normal sampling operation.

FIG. 3 is a waveform chart illustrating one example of the normal sampling operation. As illustrated in FIG. 3, in the normal sampling operation, to begin with, when a pixel reset pulse has been output at timing t01 and the reset transistor RST has been set to the ON state, charge of the floating diffusion FD is pulled out toward the power supply voltage VDD, whereby the voltage level appearing at the vertical signal line VSL becomes a reset level. Thus, based on the result of comparison by the comparator 152 between the reset level and the reference voltage REF, the counter 154 of the AD converter circuit 151 generates a count value of the reset level (sampling of the reset level). The generated count value of the reset level is stored in the register 155.

Subsequently, when a transfer pulse has been output at timing t02 and the transfer transistor TRG has been set to an ON state, charge accumulated in the cathode of the photodiode PD flows into the floating diffusion FD, whereby a pixel signal of a voltage level corresponding to the amount of received light appears at the vertical signal line VSL. Thus, based on the result of comparison by a comparator 125 between the pixel signal corresponding to the amount of received light and the reference voltage REF, the counter 154 of the AD converter circuit 151 generates a count value of the pixel signal (sampling of the pixel signal).

Subsequently, the count value of the pixel signal sampled by the counter 154 and the count value of the reset level registered in the register 155 are input to the subtracter 156. The subtracter 156 calculates a difference between the count value of the pixel signal and the count value of the reset level (CDS processing), and outputs the result as a digital value of the pixel signal of the signal component.

From this point onward, in the same manner, one sampling of a reset level and one sampling of a pixel signal are performed for one reset, whereby reading of the pixel signal for one frame from each unit pixel 131 is performed. Thus, as illustrated in FIG. 3, in order to read image data for four frames, four pixel reset pulses and four transfer pulses are output for each unit pixel 131.

1.3.2 Example of Sampling Operation According to First Embodiment

The following describes sampling operation according to the present embodiment. In the present embodiment, an example of a case in which one sampling of a reset level and two samplings of a pixel signal are performed for one reset will be described.

Figure 4:
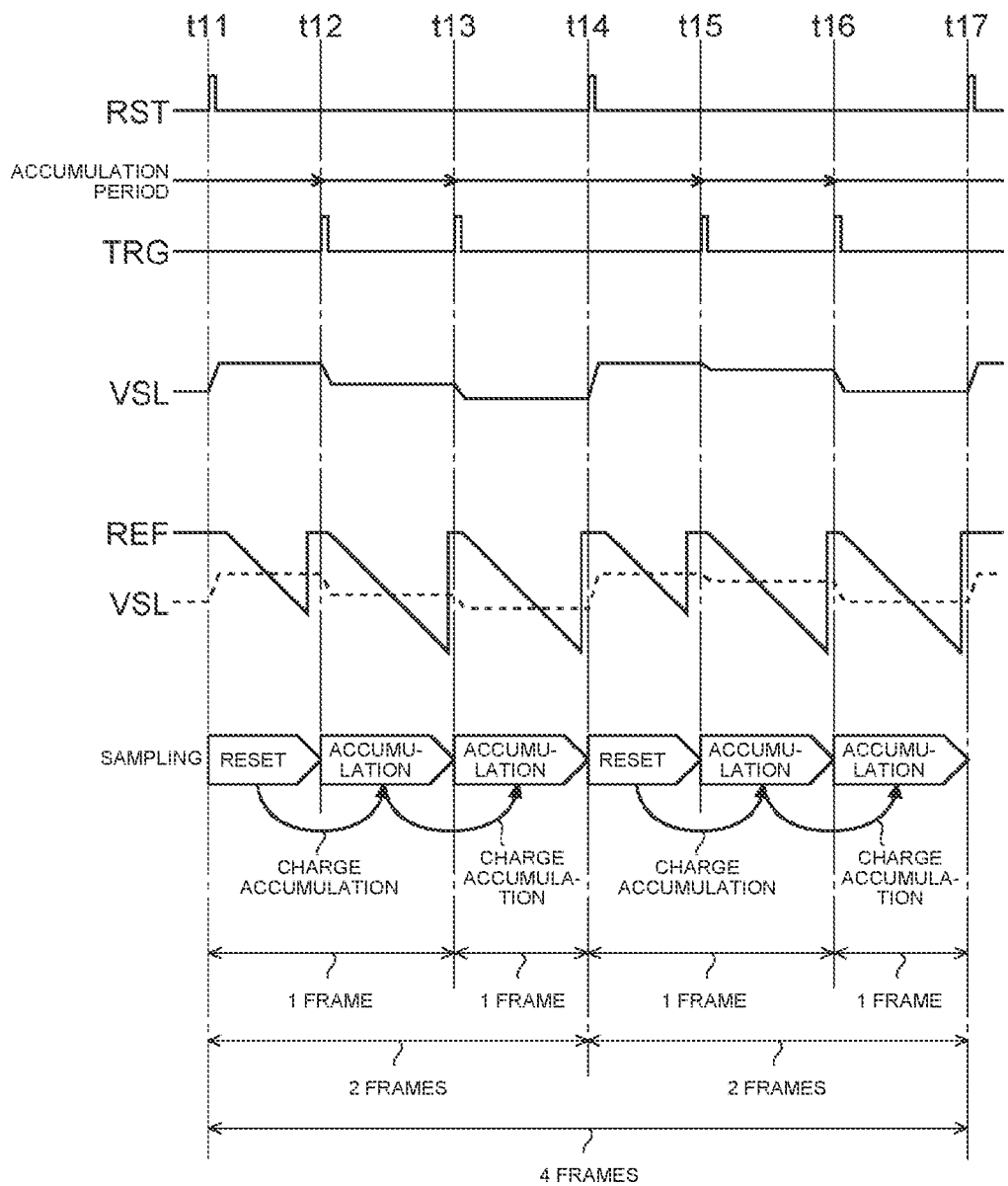
FIG. 4 is a waveform chart illustrating one example of sampling operation according to the first embodiment.

FIG. 4 is a waveform chart illustrating one example of the sampling operation according to the present embodiment. As illustrated in FIG. 4, in the sampling operation according to the present embodiment, in the same manner as in the normal sampling operation illustrated in FIG. 3, when a pixel reset pulse has been output at timing t11 and the reset transistor RST has been set to the ON state, charge of the floating diffusion FD is pulled out toward the power supply voltage VDD, whereby the voltage level appearing at the vertical signal line VSL becomes a reset level. Thus, the counter 154 of the AD converter circuit 151 generates a count value of the reset level (sampling of the reset level), and the generated count value of the reset level is stored in the register 155.

Subsequently, also in the same manner as in the normal sampling operation illustrated in FIG. 3, when a transfer pulse has been output at timing t12 and the transfer transistor TRG has been set to the ON state, charge accumulated in the cathode of the photodiode PD flows into the floating diffusion FD, whereby a pixel signal of a voltage level corresponding to the amount of received light appears at the vertical signal line VSL. Thus, the counter 154 of the AD converter circuit 151 generates a count value of the pixel signal (first sampling of the pixel signal). The count value of the pixel signal generated by the counter 154 and the count value of the reset level registered in the register 155 are input to the subtracter 156, and the subtracter 156 calculates a difference between the count value of the pixel signal and the count value of the reset level (CDS processing).

Furthermore, in the sampling operation according to the present embodiment, the count value of the reset level is read from the register 155 and is input to the subtracter 156, and then the count value of the pixel signal generated by the counter 154 is stored in the register 155.

Subsequently, in the present embodiment, sampling of the pixel signal for the subsequent frame is performed without reset being performed. Specifically, when a transfer pulse has been output at timing t13 and the transfer transistor TRG has been set to the ON state, charge accumulated in the cathode of the photodiode PD flows into the floating diffusion FD, whereby a pixel signal of a voltage level corresponding to the amount of received light appears at the vertical signal line VSL. Thus, based on the result of comparison by the comparator 125 between the pixel signal corresponding to the amount of received light and the reference voltage REF, the counter 154 of the AD converter circuit 151 generates a count value of the pixel signal (second sampling of the pixel signal). The count value of the pixel signal sampled by the counter 154 and the count value of the previous pixel signal registered in the register 155 are input to the subtracter 156, and the subtracter 156 calculates a difference between the count value of the pixel signal of this time and the count value of the previous pixel signal (CDS processing).

From this point onward, in the same manner, one sampling of a reset level and two samplings of a pixel signal are performed for one reset, whereby reading of the pixel signal for two frames from each unit pixel 131 is successively performed. Thus, as illustrated in FIG. 4, in order to read image data for four frames, two pixel reset pulses and four transfer pulses are output for each unit pixel 131.

1.3.3 Modification of Sampling Operation According to First Embodiment

Figure 5:
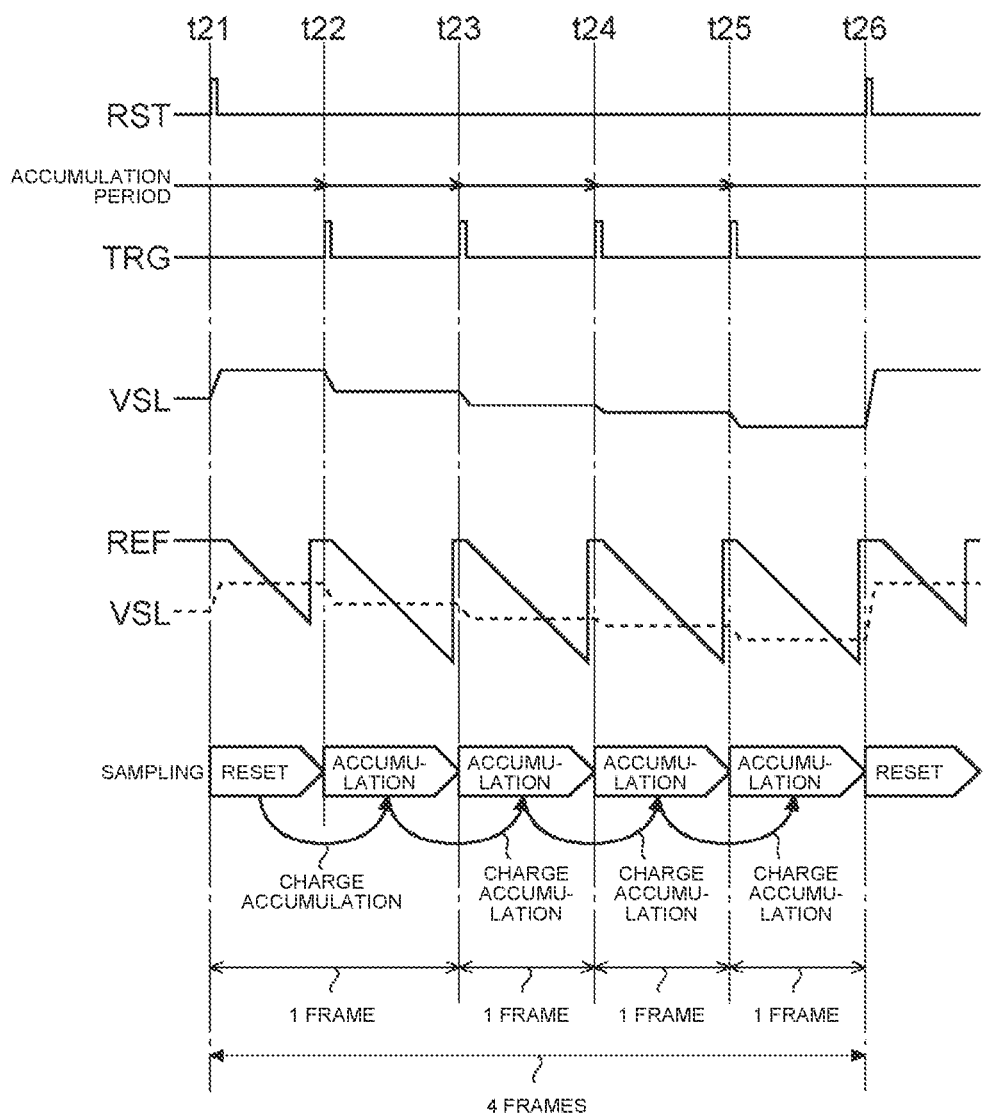
FIG. 5 is a waveform chart illustrating one example of sampling operation according to a modification of the first embodiment.

In the above-described example of the sampling operation according to the present embodiment, a case has been described in which one sampling of the reset level and two samplings of the pixel signal are performed for one reset. However, the number of times the sampling of the pixel signal is performed for one reset is not limited to two. For example, as illustrated in FIG. 5, one sampling of the reset level and four samplings of the pixel signal can be performed for one reset.

Herein, n-time transfer pulses (n is an integer of two or more) to be output after one reset pulse may be output at constant predetermined intervals, for example.

1.4 Functional Effects

As described above, in the present embodiment, sampling of the pixel signal can be performed successively in a plurality of times for one reset. In other words, in reading of a plurality of consecutive frames, during the sampling of the pixel signal for the second and subsequent times, reset of each unit pixel 131, for example, and auto zero, for example, of the comparator 152 can be omitted. Thus, according to the present embodiment, the reset period can be omitted, and the frame rate can be increased accordingly. For example, when the reset period (a period from reset to sampling of the reset level) and the sampling period for the pixel signal are substantially the same, the frame rate can be increased by about two times by performing, for one reset, all the subsequent samplings of the pixel signal without reset operation being performed therebetween.

In consecutive samplings of the pixel signal, by performing CDS processing of acquiring a difference between a previous sampling result of the pixel signal and a sampling result of the pixel signal of this time, kTC noises, for example, can be continuously canceled accurately without the need for an additional memory, for example. In other words, after a reset pulse is input to the gate of the reset transistor RST, a transfer pulse is input to the gate of the transfer transistor TRG for the n-th time (n is an integer of two or more), whereby an analog pixel signal appearing at the vertical signal line VSL is converted into a digital pixel signal. A difference between this digital pixel signal and a digital pixel signal obtained by converting an analog pixel signal that has appeared at the vertical signal line VSL when the reset pulse has been input to the gate of the reset transistor RST and then the transfer pulse has been input to the gate of the transfer transistor TRG for the (n−1)-th time is acquired. Thus, without the need for an additional memory, for example, kTC noises, for example, can be continuously canceled accurately.

Furthermore, in the present embodiment, one AD converter circuit 151 is provided to one unit pixel 131, and thus what is called a global shutter that exposes all the unit pixels 131 simultaneously can be fabricated.

In the present embodiment, the number of times the sampling of the pixel signal is performed successively for one reset may be changed dynamically. For example, when a high frame rate is required, the number of times the sampling of the pixel signal is performed successively for one reset may be increased, and when a low frame rate is allowed, the number of times the sampling of the pixel signal is performed successively for one reset may be reduced.

2. Second Embodiment

The following describes a second embodiment in detail with reference to the drawings. In the above-described first embodiment, an example has been described in which the charge accumulation period for samplings of the pixel signal to be performed successively for one reset is constant. By contrast, in the second embodiment, an example of a case in which the charge accumulation period for samplings of the pixel signal to be performed successively is dynamically changed will be described.

Figure 6:
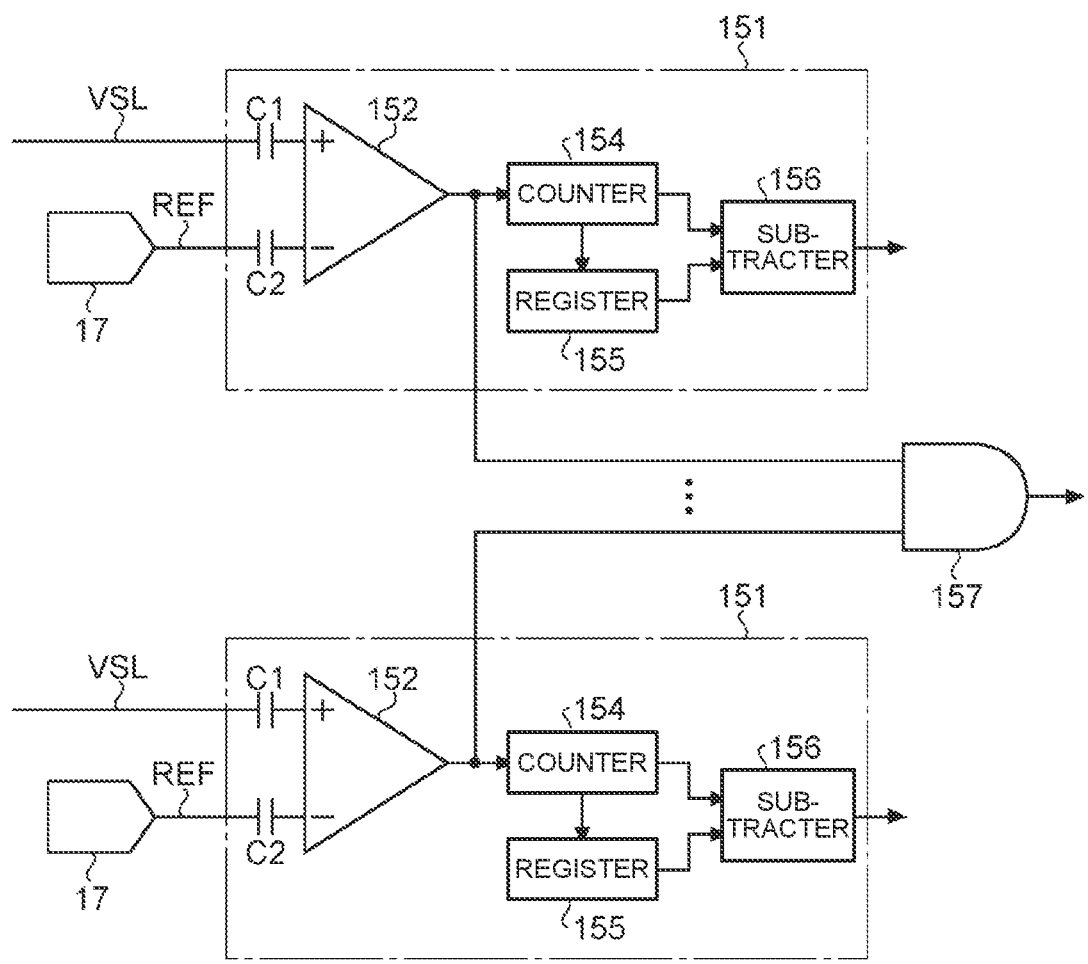
FIG. 6 is a circuit diagram illustrating a schematic configuration example of AD converter circuits and an all-inversion detecting circuit according to a second embodiment.

2.1 Schematic Configuration of Solid-State Imaging Apparatus, Unit Pixel, and AD Converter Circuit The schematic configuration of the solid-state imaging apparatus according to the present embodiment may be the same as that of the solid-state imaging apparatus 10 described with reference to FIG. 1 in the first embodiment, and thus detailed description thereof is omitted herein. The schematic configuration of each unit pixel and the corresponding AD converter circuit according to the present embodiment may be the same as that of the unit pixel 131 and the AD converter circuit 151 described with reference to FIG. 2 in the first embodiment, and thus detailed description thereof is omitted herein. In the present embodiment, as illustrated in FIG. 6, whether outputs of the comparators 152 of all the AD converter circuits 151 are inverted is detected by an all-inversion detecting circuit that is configured with an AND circuit 157, for example.

An output of the AND circuit 157 is input to the timing control circuit 11 in FIG. 1, for example. When the timing control circuit 11 has been notified by the AND circuit 157 that outputs of the comparators 152 of all the AD converter circuits 151 have been inverted, in order to start a subsequent sampling of a pixel signal among samplings of the pixel signal to be successively performed, a subsequent transfer pulse is input to each unit pixel 131 via the corresponding control line RCL.

2.2 Example of Sampling Operation

The following describes sampling operation according to the present embodiment. In the following description, an example that is based on the sampling operation according to the modification described with reference to FIG. 5 in the first embodiment will be described. However, various modifications may be made without being limited to this operation example.

Figure 7:
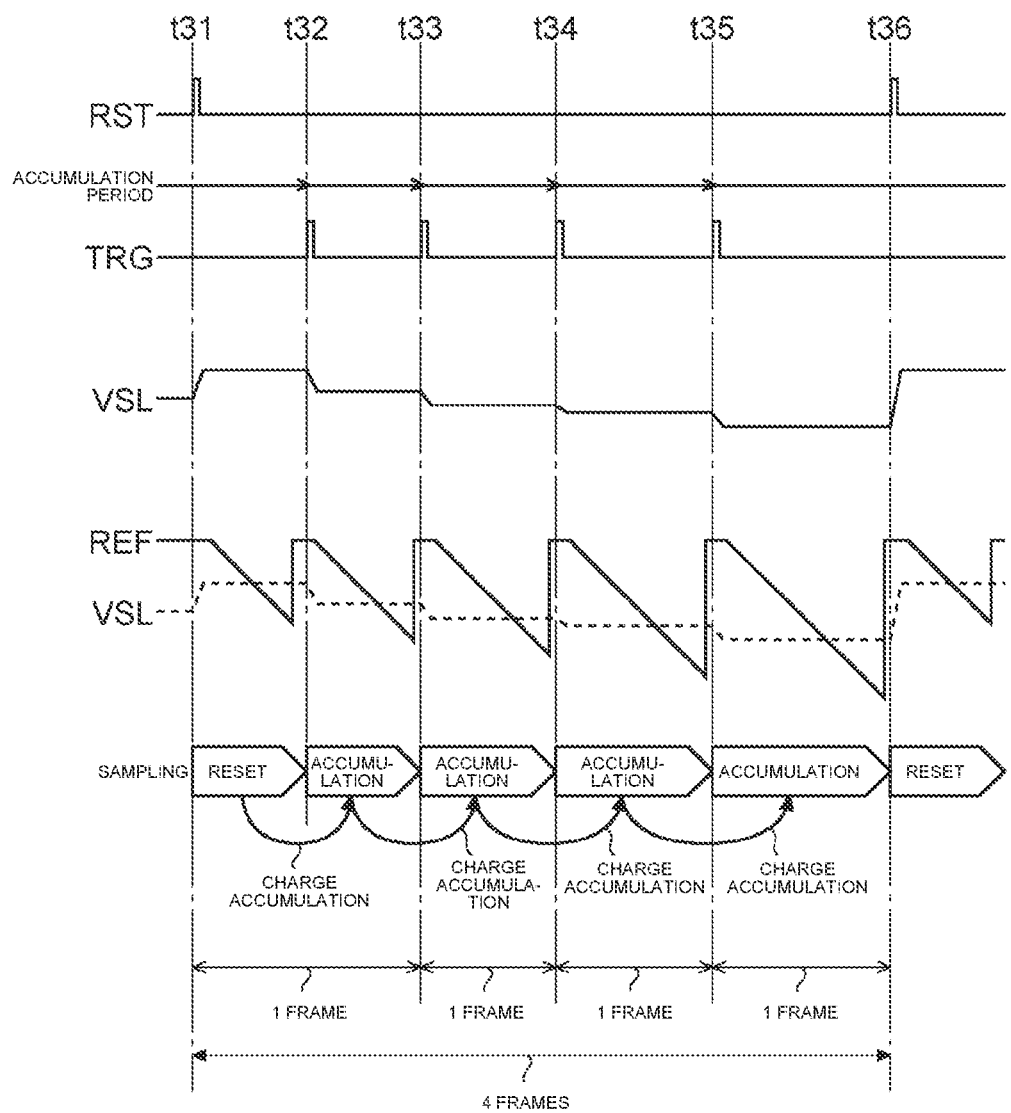
FIG. 7 is a waveform chart illustrating one example of sampling operation according to the second embodiment.

FIG. 7 is a waveform chart illustrating one example of the sampling operation according to the present embodiment. As illustrated in FIG. 7, in the sampling operation according to the present embodiment, the charge accumulation period for samplings of a pixel signal to be performed successively for one reset is dynamically changed in comparison with the sampling operation according to the modification of the first embodiment illustrated in FIG. 5, for example.

Herein, as illustrated in FIG. 7, basically, every time charge transfer from the photodiode PD to the floating diffusion FD is repeated, charge accumulated in the floating diffusion FD increases and the voltage level of the pixel signal appearing at the vertical signal line VSL decreases. Thus, a period until the comparator 152 is inverted increases gradually, which causes the sampling period to increase gradually from the first sampling of the pixel signal (timings t31 to t32) through the last sampling of the pixel signal (timings t35 to t36). This indicates that, among the samplings of the pixel signal to be performed successively for one reset, time required for initial-stage samplings of the pixel signal can be shortened. This allows the time required therefor to be shortened, and the frame rate can be increased accordingly.

Herein, also for later samplings of the pixel signal, subsequent samplings of the pixel signal are performed as soon as all the comparators 152 have been inverted, and thus the sampling period can be shortened more than when the sampling period is fixed.

2.3 Functional Effects

As described above, in the present embodiment, for samplings of the pixel signal to be performed successively for one reset, each sampling of the pixel signal is shifted to the subsequent one as soon as outputs of all the comparators 152 have been inverted, and thus the sampling period required for each sampling of the pixel signal can be shortened. This enables the frame rate to be increased.

Because the other configurations, operations, and effects may be the same as those of the above-described embodiment, detailed description thereof is omitted herein.

3. Third Embodiment

The following describes a third embodiment in detail with reference to the drawings. In the present embodiment, an example of a case in which the solid-state imaging apparatus 10 according to the above-described embodiments is applied to a radiation detector will be described. Examples of the radiation detector according to the present embodiment may include an X-ray detector and a transmission X-ray imaging apparatus.

3.1 Radiation Measurement System

Figure 8:
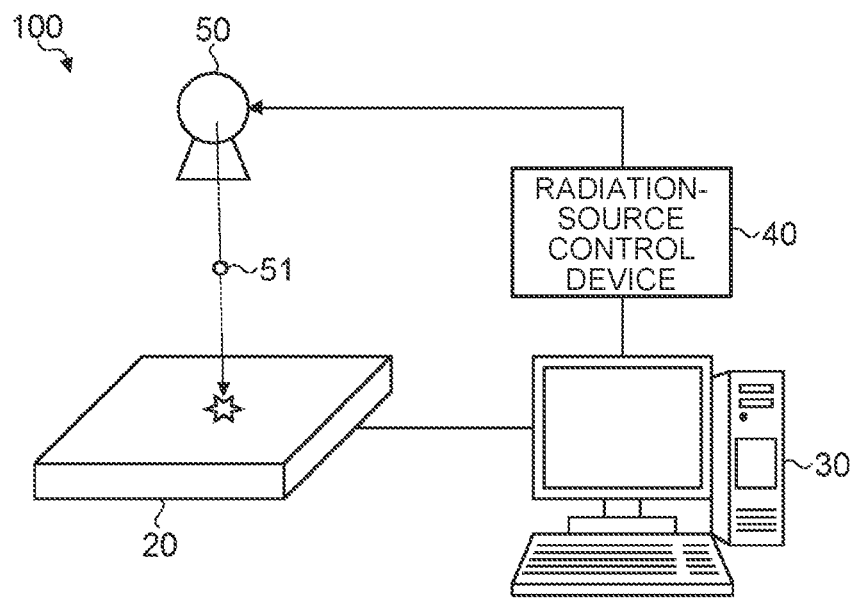
FIG. 8 is a schematic diagram illustrating a schematic configuration example of a radiation measurement system according to a third embodiment.

FIG. 8 is a schematic diagram illustrating a schematic configuration example of a radiation measurement system according to the present embodiment. As illustrated in FIG. 8, this radiation measurement system 100 includes a radiation detector 20, an information processing device 30, a radiation-source control device 40, and a radiation source 50.

The information processing device 30 is configured with a personal computer, for example, and performs analysis of image data acquired by a user with the radiation detector 20 and control of the radiation-source control device 40 described later, for example.

The radiation-source control device 40 controls emission of radiation from the radiation source 50 in accordance with instructions from the information processing device 30, for example.

The radiation source 50 is a radiation source that emits, for example, gamma rays (photons 51) such as X-rays. However, the radiation source is not limited to this, and radiation sources that emit various types of radiation such as alpha rays, beta rays, protons, and neutrons may be used.

The radiation detector 20 includes the solid-state imaging apparatus 10 according to the above-described embodiments, and generates a two-dimensional image based on energies of photons 51 emitted from the radiation source 50 and incident positions thereof to output the image to the information processing device 30.

3.2 Radiation Detector

Figure 9:
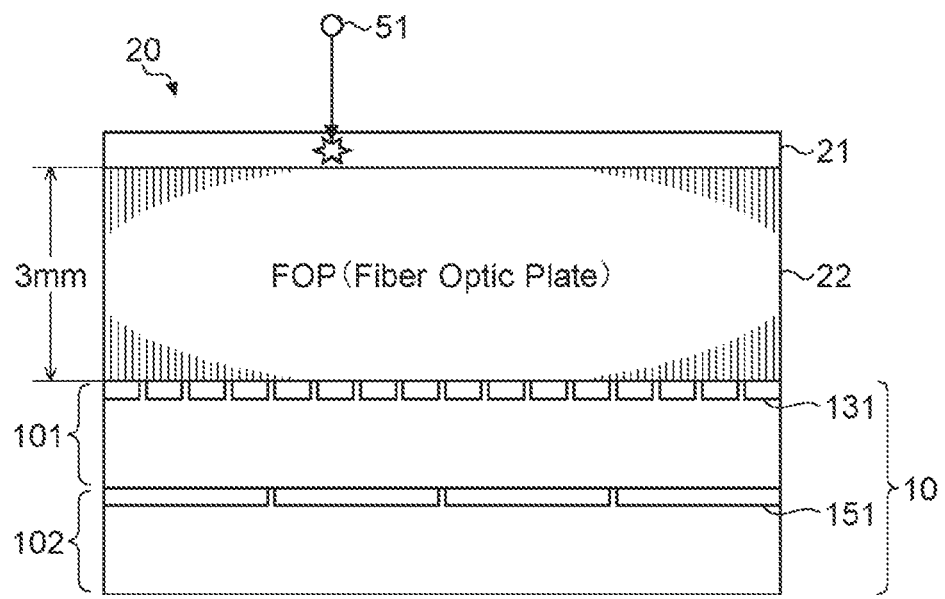
FIG. 9 is a sectional view illustrating a schematic configuration example of a radiation detector according to the third embodiment.

FIG. 9 is a sectional view illustrating a schematic configuration example of the radiation detector according to the present embodiment. In FIG. 9, a cross-section structure thereof in a plane orthogonal to a light receiving surface (a surface of the photodiode PD on which light is incident from outside) of the solid-state imaging apparatus 10 is illustrated.

As illustrated in FIG. 9, the radiation detector 20 includes a fiber optic plate (FOP) 22 provided to a light incident surface of the solid-state imaging apparatus 10 and a scintillator 21 that is arranged on a side thereof opposite to the solid-state imaging apparatus 10 with the FOP 22 interposed therebetween.

As the scintillator 21, for example, a crystal scintillator such as CsI(Tl) may be used. However, the scintillator is not limited to this, and various types of scintillators that convert incident radiation into light, such as a GSO single crystal scintillator, a plastic scintillator, and a liquid scintillator may be used. For example, when a scintillator having a columnar crystal structure is used, generated light can be efficiently guided to the FOP 22, whereby the sensitivity of the radiation detector 20 can be increased.

The FOP 22 is an optical waveguide having a plurality of optical fibers bundled together, for example. As each optical fiber, an optical fiber having high transmittance of light emitted from the scintillator 21 is preferably used. Light emitted from the scintillator 21 enters one end of any one of the optical fibers. The light that have entered the optical fiber is emitted from the other end while being totally reflected in the optical fiber.

At the other end of the optical fiber, the light receiving surface of the solid-state imaging apparatus 10 is arranged. The photodiode PD of each unit pixel 131 of the solid-state imaging apparatus 10 subjects light incident through the optical fiber to photoelectric conversion, thereby accumulating charge corresponding to the amount of the incident light in the cathode thereof.

The FOP 22 does not necessarily have to be provided between the scintillator 21 and the solid-state imaging apparatus 10. For example, the FOP 22 may be omitted, and the scintillator 21 may be brought into direct contact with the light receiving surface of the solid-state imaging apparatus 10.

3.3 Configuration Example of Solid-State Imaging Apparatus

Herein, as illustrated in FIG. 9, the solid-state imaging apparatus 10 has a layered structure of, for example, a first semiconductor substrate 101 provided with the respective unit pixels 131 and a second semiconductor substrate 102 provided with peripheral circuits including the AD converter circuits 151. The peripheral circuits include the timing control circuit 11, the pixel drive circuit 12, the reference voltage generator 17, the horizontal transfer circuit 18, and the output circuit 19.

Figure 10:
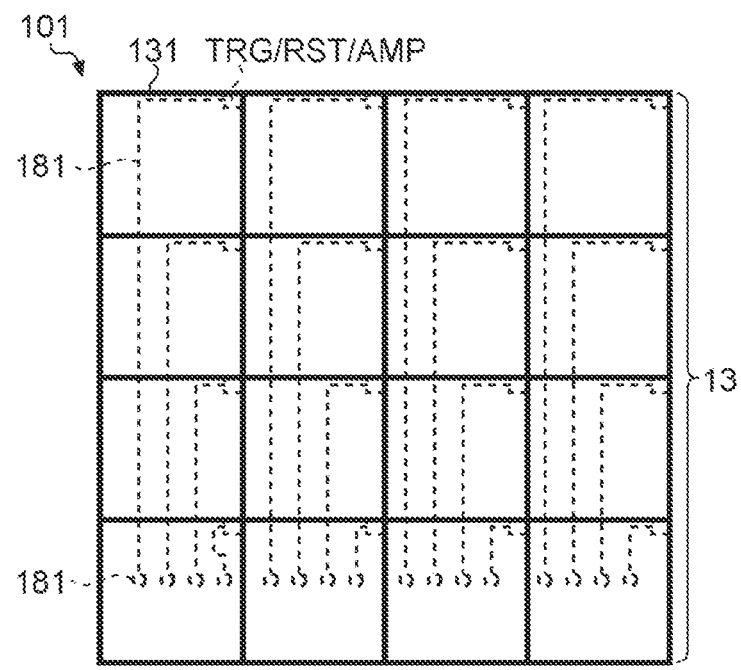
FIG. 10 is a top view illustrating a configuration example of a first semiconductor substrate according to the third embodiment.

FIG. 10 is a top view illustrating a configuration example of the first semiconductor substrate according to the present embodiment. For simplicity of description, in FIG. 10, an example is illustrated in which unit pixels 131 the total number of which is 16 of 4×4 are provided to the first semiconductor substrate 101. However, as described above, in reality, for example, several tens to several thousands of unit pixels 131 (e.g., photodiodes PD) can be arranged in each row and in each column.

As illustrated in FIG. 10, on the first semiconductor substrate 101, the respective unit pixels 131 are arranged in a two-dimensional matrix. On the back side of the first semiconductor substrate 101, wires 181 and connection portions 182 for electrically connecting between the respective unit pixels 131 and circuit elements in the second semiconductor substrate 102 are provided. The wires 181 and the connection portions 182 correspond to the vertical signal lines VSL of the respective unit pixels 131.

Figure 11:
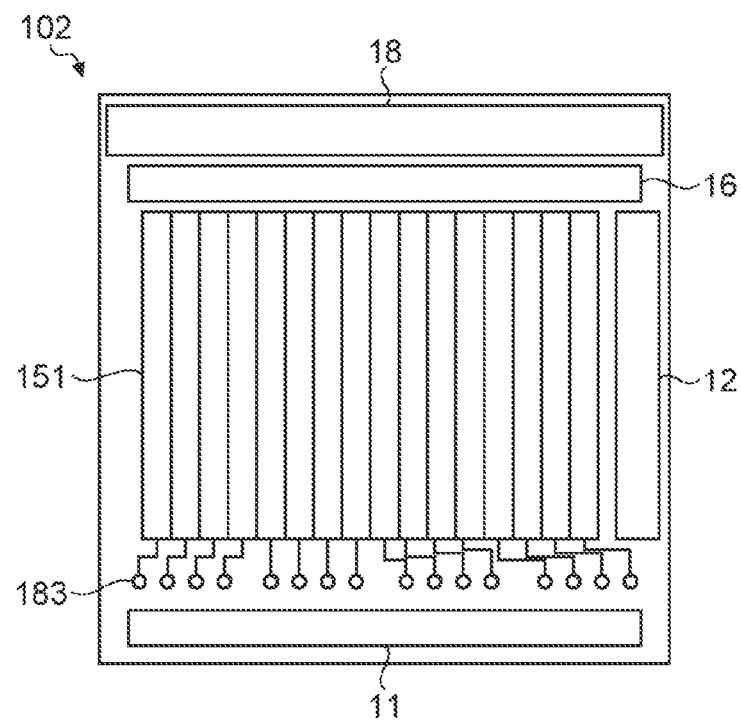
FIG. 11 is a top view illustrating a configuration example of a second semiconductor substrate according to the third embodiment.

FIG. 11 is a top view illustrating a configuration example of the second semiconductor substrate according to the present embodiment. As illustrated in FIG. 11, the second semiconductor substrate 102 is provided with connection portions 183 that are provided at positions corresponding to the connection portions 182 in the first semiconductor substrate 101 and the AD converter circuits 151. The second semiconductor substrate 102 is also provided with the timing control circuit 11, the pixel drive circuit 12, and the horizontal transfer circuit 18 as the peripheral circuits. Furthermore, although not illustrated, the second semiconductor substrate 102 is also provided with the reference voltage generator 17 and the output circuit 19.

By using a layered structure for the solid-state imaging apparatus 10 in this manner, the area of each unit pixel 131 can be reduced, and thus the packaging density of the unit pixels 131 can be increased and resolution can be increased. Furthermore, the photodiodes PD can be arranged on almost the entire area of the light receiving surface of the first semiconductor substrate 101, and thus the efficiency of using the light receiving surface can be increased and the solid-state imaging apparatus 10 can be downsized, for example.

In the configuration described above, the connection portions 182 and 183 may be electrode pads, for example, or may be through wires such as through silicon vias (TSV). When electrode pads made of copper (Cu) are used as the connection portions 182 and 183, the first semiconductor substrate 101 and the second semiconductor substrate 102 can be bonded together by using a technique such as Cu—Cu bonding. When through wires are used as the connection portions 182 and 183, the first semiconductor substrate 101 and the second semiconductor substrate 102 are bonded together by using a bonding technique such as optical contact.

The layered structure of the solid-state imaging apparatus 10 is not limited to two layers, and may have three or more layers. In this case, the AD converter circuits 151 may be arranged in a second layer at the midpoint, and the timing control circuit 11, the pixel drive circuit 12, the reference voltage generator 17, the horizontal transfer circuit 18, and the output circuit 19 may be arranged in a third layer at the bottom.

3.4 Cross-Section Structure Example of Unit Pixel

Figure 12:
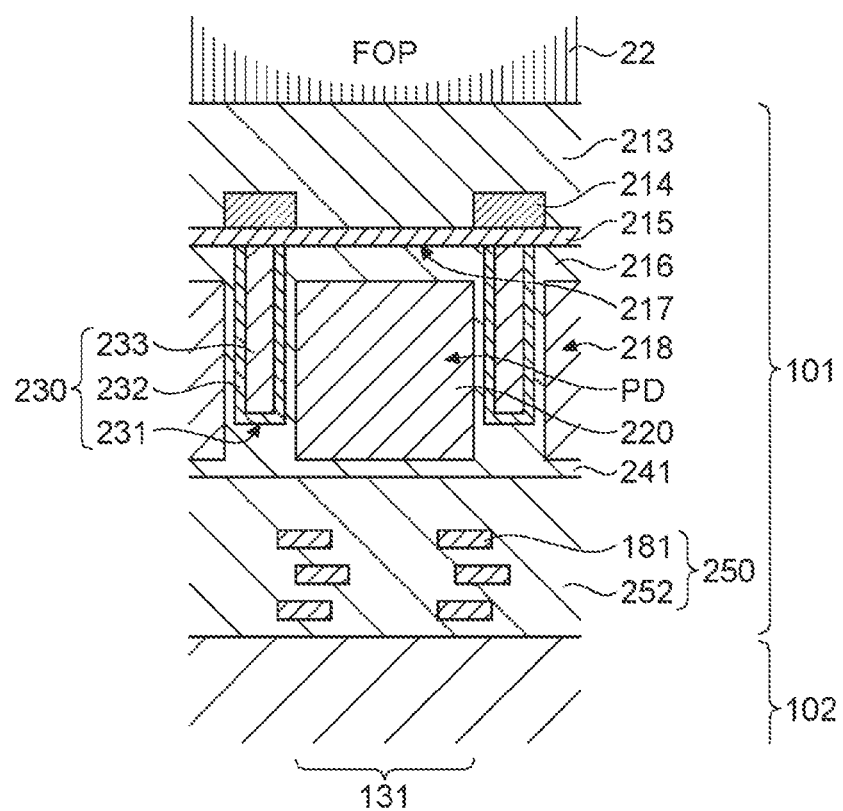
FIG. 12 is a sectional view illustrating a cross-section structure example of the first semiconductor substrate according to the third embodiment.

The following describes a cross-section structure of the first semiconductor substrate 101 according to the present embodiment. FIG. 12 is a sectional view of a cross-section structure example of the first semiconductor substrate according to the present embodiment. In FIG. 12, a cross-section structure thereof in a plane orthogonal to the light receiving surface of the photodiode PD is illustrated.

As illustrated in FIG. 12, in the first semiconductor substrate 101, the photodiode PD receives incident light entering from the back side (the upper side in the drawing) of a semiconductor substrate 218 through the FOP 22. Above the photodiode PD, a flattening film 213 is provided, and incident light that has entered sequentially through respective parts is received by a light receiving surface 217 and is subjected to photoelectric conversion.

For example, in the photodiode PD, an n-type semiconductor region 220 is formed as a charge accumulation region in which charge (electrons) is accumulated. In the photodiode PD, the n-type semiconductor region 220 is provided inside p-type semiconductor regions 216 and 241 of the semiconductor substrate 218. On the front side (the lower side) of the semiconductor substrate 218 in the n-type semiconductor region 220, the p-type semiconductor region 241 in which the impurity concentration is higher than in the back side (the upper surface) is provided. In other words, the photodiode PD has a hole-accumulation diode (HAD) structure, and the p-type semiconductor regions 216 and 241 are formed so as to prevent a dark current from being generated in the respective interfaces to the upper side and the lower side of the n-type semiconductor region 220.

Inside the semiconductor substrate 218, a pixel isolation unit 230 that electrically isolates a plurality of unit pixels 131 (e.g., photodiodes PD) from each other is provided, and the photodiode PD is provided in each of regions partitioned by the pixel isolation unit 230. In the drawing, when the first semiconductor substrate 101 is viewed from the upper side, the pixel isolation unit 230 is formed, for example, in a lattice pattern so as to be interposed between the unit pixels 131 (e.g., photodiodes PD), and the photodiode PD is formed in each of regions partitioned by the pixel isolation unit 230.

In each photodiode PD, the anode thereof is grounded, and in the solid-state imaging apparatus 10, signal charge (e.g., electrons) accumulated by the photodiode PD is read by the floating diffusion FD via the transfer transistor TRG (not illustrated), for example, and is output as an electrical signal via the amplifier transistor AMP to the vertical signal line VSL (not illustrated).

A wiring layer 250 and the respective transistors (not illustrated) of the unit pixel 131 are provided on a front surface (lower surface) opposite to a back surface (upper surface) on which a light-shielding film 214, the flattening film 213, and the like of the semiconductor substrate 218 are provided.

The wiring layer 250 includes the wires 181 and an insulating layer 252, and is formed such that the wires 181 are electrically connected to the respective elements in the insulating layer 252. The wiring layer 250 is what is called a multilayer wiring layer, and is formed such that interlayer insulating films constituting the insulating layer 252 and the wires 181 are alternately stacked in a plurality of times. Herein, as the wires 181, respective wires such as a wire connecting between transistors in the unit pixel 131, a wire for driving the unit pixel 131, and the vertical signal line VSL are stacked with the insulating layer 252 interposed therebetween.

On a surface of the wiring layer 250 opposite to the side on which the photodiode PD, the second semiconductor substrate 102 is provided.

The light-shielding film 214 is provided on the back side (the upper side in the drawing) of the semiconductor substrate 218.

The light-shielding film 214 is configured to block part of incident light traveling from above the semiconductor substrate 218 toward the back surface of the semiconductor substrate 218.

The light-shielding film 214 is provided above the pixel isolation unit 230 provided inside the semiconductor substrate 218. Herein, the light-shielding film 214 is provided on a back surface (upper surface) of the semiconductor substrate 218 so as to protrude in a projecting shape with an insulating film 215 such as a silicon oxide film interposed therebetween. By contrast, above the photodiode PD provided inside the semiconductor substrate 218, the light-shielding film 214 is not provided, and an opening is formed so that incident light can enter the photodiode PD.

In other words, in the drawing, when the first semiconductor substrate 101 is viewed from the upper side, the planar shape of the light-shielding film 214 has a lattice pattern and openings are formed therein, through which incident light passes to the light receiving surface 217.

The light-shielding film 214 is formed of a light-shielding material that blocks light. For example, the light-shielding film 214 is formed by sequentially stacking a titanium (Ti) film and a tungsten (W) film. Otherwise, the light-shielding film 214 may be formed by sequentially stacking, for example, a titanium nitride (TiN) film and a tungsten (W) film.

The light-shielding film 214 is coated with the flattening film 213. The flattening film 213 is formed using an insulating material that transmits light. The pixel isolation unit 230 includes a groove portion 231, a fixed charge film 232, and an insulating film 233.

The fixed charge film 232 is formed so as to cover the groove portion 231, which partitions the unit pixels 131 from each other, on the back side (upper side) of the semiconductor substrate 218.

Specifically, the fixed charge film 232 is provided so as to coat the inner surface of the groove portion 231 formed on the back side (upper side) of the semiconductor substrate 218. The insulating film 233 is provided (filled) so as to fill up the inside of the groove portion 231 coated with the fixed charge film 232.

Herein, the fixed charge film 232 is formed using a high dielectric having negative fixed charge such that a positive charge (hole) accumulation region is formed at an interface portion thereof to the semiconductor substrate 218 to prevent a dark current from being generated. Because the fixed charge film 232 is formed so as to have negative fixed charge, an electric field is applied to the interface to the semiconductor substrate 218 by the negative fixed charge, whereby the positive charge (hole) accumulation region is formed.

The fixed charge film 232 may be formed of a hafnium oxide film ($HfO_2$ film), for example. The fixed charge film 232 may be formed so as to otherwise include at least one of oxides of hafnium, zirconium, aluminum, tantalum, titanium, magnesium, yttrium, and lanthanoid elements, for example.

3.5 Functional Effects

As described above, the solid-state imaging apparatus 10 exemplified in the first and second embodiments can be used as the radiation detector 20, such as a survey meter or a transmission X-ray imaging apparatus, that detects a low-light pulse generated by X-ray scintillation light that enters frequently at irregular intervals. Thus, the radiation detector 20 that can acquire two-dimensional images at a high frame rate and the radiation measurement system 100 provided therewith can be built.

Because the other configurations, operations, and effects may be the same as those of the above-described embodiments, detailed description thereof is omitted herein.

Furthermore, in the present embodiment, a case has been described in which the radiation detector 20 is configured using the solid-state imaging apparatus 10. However, the present invention is not limited to this, and the solid-state imaging apparatus 10 according to the above-described embodiments may be used for, for example, an image sensor that can acquire gray scale images and color images.

Although the embodiments according to the present disclosure have been described above, the technical scope of the present disclosure is not limited to the above-described respective embodiments on an as-is basis, and various modifications may be made within the scope not departing from the gist of the present disclosure. Components from different embodiments and modifications may be combined as appropriate.

The effects in the respective embodiments described herein are merely examples and are not restrictive, and other effects may be applicable.

It should be noted that the present technique can assume the following configuration.

(1)

A solid-state imaging apparatus comprising:
 a photoelectric conversion element that converts an incident photon into charge;
 a transfer transistor that transfers the charge generated in the photoelectric conversion element to a charge accumulation portion;
 a reset transistor that discharges the charge in the charge accumulation portion,
 an amplifier transistor that causes a voltage having a voltage value corresponding to the amount of the charge in the charge accumulation portion to appear at a vertical signal line;
 a converter circuit that is connected to the vertical signal line and converts an analog voltage appearing at the vertical signal line into a digital voltage value;
 a first signal line that is connected to a gate of the reset transistor;
 a second signal line that is connected to a gate of the transfer transistor; and
 a drive circuit that outputs to the first signal line a reset pulse for causing the reset transistor to discharge the charge in the charge accumulation portion, and outputs to the second signal line a transfer pulse for causing the transfer transistor to transfer the charge generated in the photoelectric conversion element to the charge accumulation portion, wherein
 the drive circuit outputs the reset pulse to the first signal line, and then outputs the transfer pulse to the second signal line successively in two or more times.

(2)

The solid-state imaging apparatus according to (1), wherein the converter circuit
 converts a first voltage that appears at the vertical signal line when the reset pulse is output to the first signal line into a digital first voltage value, converts a second voltage that appears at the vertical signal line when the reset pulse is output to the first signal line and then the transfer pulse is output to the second signal line for the first time into a digital second voltage value, and acquires a difference between the first voltage value and the second voltage value, and also
 converts a third voltage that appears at the vertical signal line when the reset pulse is output to the first signal line and then the transfer pulse is output to the second signal line for the n-th time (n is an integer of two or more) into a digital third voltage value, and acquires a difference between this third voltage value and a digital fourth voltage value that is obtained by converting a fourth voltage that appears at the vertical signal line when the transfer pulse is output to the second signal line for the (n−1)-th time immediately before the n-th time.

(3)

The solid-state imaging apparatus according to (1), wherein the converter circuit includes: a converter that converts an analog voltage appearing at the vertical signal line into a digital voltage value; a holding unit that holds the voltage value converted by the converter; and a subtracter that acquires a difference between the voltage value converted by the converter and the voltage value held by the holding unit.

(4)

The solid-state imaging apparatus according (3), wherein the converter includes: a comparator that compares an analog voltage appearing at the vertical signal line with a reference voltage input from outside; and a counter that converts the analog voltage into a digital voltage value, based on a result of comparison by the comparator.

(5)

The solid-state imaging apparatus according to (4), further comprising:
 a reference voltage generator that generates a reference voltage having a sawtooth waveform in which the voltage rises or falls in a linear or a stepwise manner; and
 a control circuit that outputs clock signals having a predetermined cycle to the counter, wherein
 the comparator inputs a result of comparison between an analog voltage appearing at the vertical signal line and the reference voltage to the counter, and
 the counter counts the number of the clock signals that have been input until a reference result output from the comparator is inverted, thereby converting the analog voltage into a digital voltage value.

(6)

The solid-state imaging apparatus according to any one of (1) to (5), wherein the drive circuit outputs the reset pulse to the first signal line, and then outputs the transfer pulse to the second signal line at predetermined intervals.

(7)

The solid-state imaging apparatus according to (4) or (5), comprising:
a plurality of the converter circuits; and
an all-inversion detecting circuit that inputs output of the comparator of each of the converter circuits, wherein
when the all-inversion detecting circuit has detected that all the outputs of the comparators of the respective converter circuits have been inverted, the drive circuit outputs the subsequent transfer pulse to the second signal line or outputs the reset pulse to the first signal line.

(8)

The solid-state imaging apparatus according to (7), wherein the all-inversion detecting circuit is an AND circuit.

(9)

The solid-state imaging apparatus according to any one of (1) to (8), comprising:
a plurality of the photoelectric conversion elements; and
a plurality of the converter circuits, wherein
the photoelectric conversion elements and the converter circuits are associated on a one-to-one basis.

(10)

A radiation detector comprising:
a photoelectric conversion element that converts an incident photon into charge;
a scintillator that is arranged on a light receiving surface of the photoelectric conversion element;
a transfer transistor that transfers the charge generated in the photoelectric conversion element to a charge accumulation portion;
a reset transistor that discharges the charge in the charge accumulation portion;
an amplifier transistor that causes a voltage having a voltage value corresponding to the amount of the charge in the charge accumulation portion to appear at a vertical signal line;
a converter circuit that is connected to the vertical signal line and converts an analog voltage appearing at the vertical signal line into a digital voltage value;
a first signal line that is connected to a gate of the reset transistor;
a second signal line that is connected to a gate of the transfer transistor; and
a drive circuit that outputs to the first signal line a reset pulse for causing the reset transistor to discharge the charge in the charge accumulation portion, and outputs to the second signal line a transfer pulse for causing the transfer transistor to transfer the charge generated in the photoelectric conversion element to the charge accumulation portion, wherein
the drive circuit outputs the reset pulse to the first signal line, and then outputs the transfer pulse to the second signal line successively in two or more times.

(11)

The radiation detector according to (10), wherein the scintillator includes any one of a CsI(Tl) scintillator, a GSO single crystal scintillator, and a plastic scintillator.

(12)

The radiation detector according to (10) or (11), wherein the scintillator has a columnar crystal structure.

(13)

The radiation detector according to any one of (10) to (12), further comprising an optical waveguide that is arranged between the scintillator and the photoelectric conversion element and guides light generated in the scintillator to the photoelectric conversion element.

(14)

The radiation detector according to (13), wherein the optical waveguide includes an optical fiber.

(15)

A radiation measurement system comprising:
a photoelectric conversion element that converts an incident photon into charge;
a scintillator that is arranged on a light receiving surface of the photoelectric conversion element;
a transfer transistor that transfers the charge generated in the photoelectric conversion element to a charge accumulation portion;
a reset transistor that discharges the charge in the charge accumulation portion;
an amplifier transistor that causes a voltage having a voltage value corresponding to the amount of the charge in the charge accumulation portion to appear at a vertical signal line;
a converter circuit that is connected to the vertical signal line and converts an analog voltage appearing at the vertical signal line into a digital voltage value;
an output circuit that outputs the digital voltage value converted by the converter circuit as image data;
a first signal line that is connected to a gate of the reset transistor;
a second signal line that is connected to a gate of the transfer transistor; and
a drive circuit that outputs to the first signal line a reset pulse for causing the reset transistor to discharge the charge in the charge accumulation portion, and outputs to the second signal line a transfer pulse for causing the transfer transistor to transfer the charge generated in the photoelectric conversion element to the charge accumulation portion, wherein
the drive circuit outputs the reset pulse to the first signal line, and then outputs the transfer pulse to the second signal line successively in two or more times.

(16)

The radiation measurement system according to (15), further comprising an information processing device that analyzes the image data output from the output circuit.

(17)

The radiation measurement system according to (15) or (16), further comprising a radiation source that emits radiation.

(18)

The radiation measurement system according to (17), wherein the radiation source emits at least one of an alpha ray, a beta ray, and a gamma ray.

(19)

The radiation measurement system according to (17) or (18), further comprising a radiation-source control device that controls emitting of the radiation from the radiation source.

(20)

The radiation measurement system according to any one of (15) to (19), wherein the radiation measurement system is a survey meter or a transmission X-ray imaging apparatus.

REFERENCE SIGNS LIST 10 solid-state imaging apparatus
11 timing control circuit
12 pixel drive circuit
13 pixel array unit
14 constant current circuit
15 sampling circuit 17 reference voltage generator
18 horizontal transfer circuit
19 output circuit
20 radiation detector
21 scintillator
22 FOP
30 information processing device
40 radiation-source control device
50 radiation source
51 photon
100 radiation measurement system
101 first semiconductor substrate
102 second semiconductor substrate
131 unit pixel
141 load MOS transistor
151 AD converter circuit
152 comparator
154 counter
155 register
156 subtracter
157 AND circuit
181 wire
182, 183 connection portion
213 flattening film
214 light-shielding film
215 insulating film
216, 241 p-type semiconductor region
217 light receiving surface
218 semiconductor substrate
220 n-type semiconductor region
230 pixel isolation unit
231 groove portion
232 fixed charge film
233 insulating film
AMP amplifier transistor
C1, C2 coupling capacitor
FD floating diffusion
HSL horizontal signal line
PD photodiode
RCL control line
RST reset transistor
TRG transfer transistor
VSL vertical signal line

The invention claimed is:
1. A solid-state imaging apparatus, comprising:
a plurality of unit pixels, wherein each unit pixel of the plurality of unit pixels comprises:
  a photoelectric conversion element configured to convert an incident photon into charge;
  a transfer transistor configured to transfer the charge generated in the photoelectric conversion element to a charge accumulation portion;
  a reset transistor configured to discharge the charge in the charge accumulation portion;
  an amplifier transistor configured to cause an analog voltage having a voltage value corresponding to an amount of the charge in the charge accumulation portion to appear at a vertical signal line;
  a converter circuit that is connected to the vertical signal line, wherein the converter circuit is configured to convert the analog voltage that appears at the vertical signal line into a digital voltage value;
  a first signal line that is connected to a gate of the reset transistor;
  a second signal line that is connected to a gate of the transfer transistor; and
a drive circuit configured to:
  output a reset pulse to the first signal line to cause the reset transistor to discharge the charge in the charge accumulation portion; and
  output a transfer pulse to the second signal line to cause the transfer transistor to transfer the charge generated in the photoelectric conversion element to the charge accumulation portion, wherein
  the transfer pulse is output to the second signal line successively at least two times subsequent to the output of the reset pulse to read pixel signals corresponding to at least two frames from each unit pixel of the plurality of unit pixels prior to a next reset pulse.

2. The solid-state imaging apparatus according to claim 1, wherein the converter circuit is further configured to:
  convert a first voltage that appears at the vertical signal line in a case where the reset pulse is output to the first signal line into a first digital voltage value;
  convert a second voltage that appears at the vertical signal line in a case where the reset pulse is output to the first signal line and then the transfer pulse is output to the second signal line for a first time into a second digital voltage value;
  acquire a difference between the first digital voltage value and the second digital voltage value;
  convert a third voltage that appears at the vertical signal line in a case where the reset pulse is output to the first signal line and then the transfer pulse is output to the second signal line for n-th time into a third digital voltage value, wherein n is an integer of two or more; and
  acquire a difference between the third digital voltage value and a fourth digital voltage value that is obtained by converting a fourth voltage that appears at the vertical signal line in a case where the transfer pulse is output to the second signal line for (n−1)-th time immediately before the n-th time.

3. The solid-state imaging apparatus according to claim 1, wherein the converter circuit includes:
  a converter configured to convert the analog voltage appearing at the vertical signal line into the digital voltage value;
  a holding unit configured to hold the voltage value converted by the converter; and
  a subtracter configured to acquire a difference between the voltage value converted by the converter and the voltage value held by the holding unit.

4. The solid-state imaging apparatus according claim 3, wherein the converter includes:
  a comparator configured to compare the analog voltage appearing at the vertical signal line with a reference voltage input from outside; and
  a counter configured to convert the analog voltage into the digital voltage value, based on a result of the comparison by the comparator.

5. The solid-state imaging apparatus according to claim 4, further comprising:
  a reference voltage generator configured to generate a reference voltage having a sawtooth waveform in which the reference voltage rises or falls in one of a linear or a stepwise manner; and
  a control circuit configured to output clock signals having a determined cycle to the counter, wherein the comparator is further configured to input the result of the comparison between the analog voltage appearing at the vertical signal line and the reference voltage to the counter, and the counter is further configured to count a number of the clock signals that have been input until a reference result output from the comparator is inverted, to thereby convert the analog voltage into the digital voltage value.

6. The solid-state imaging apparatus according to claim 4, further comprising:
a plurality of converter circuits including the converter circuit; and
an all-inversion detecting circuit configured to input output of the comparator of each of the plurality of converter circuits, wherein
in a case where the all-inversion detecting circuit has detected that the output of the comparator of each respective converter circuit of the plurality of converter circuits have been inverted, the drive circuit is further configured to one of output a subsequent transfer pulse to the second signal line or output the reset pulse to the first signal line.

7. The solid-state imaging apparatus according to claim 6, wherein the all-inversion detecting circuit is an AND circuit.

8. The solid-state imaging apparatus according to claim 1, wherein the drive circuit is further configured to output the reset pulse to the first signal line, and then output the transfer pulse to the second signal line at determined intervals.

9. The solid-state imaging apparatus according to claim 1, further comprising:
a plurality of photoelectric conversion elements including the photoelectric conversion element; and
a plurality of converter circuits including the converter circuit, wherein the plurality of photoelectric conversion elements is associated with plurality of the converter circuits on a one-to-one basis.

10. A radiation detector, comprising:
a plurality of unit pixels, wherein each unit pixel of the plurality of unit pixels comprises:
a photoelectric conversion element configured to convert an incident photon into charge;
a transfer transistor configured to transfer the charge generated in the photoelectric conversion element to a charge accumulation portion;
a reset transistor configured to discharge the charge in the charge accumulation portion;
an amplifier transistor configured to cause an analog voltage having a voltage value corresponding to an amount of the charge in the charge accumulation portion to appear at a vertical signal line;
a scintillator on a light receiving surface of the photoelectric conversion element;
a converter circuit that is connected to the vertical signal line, wherein the converter circuit is configured to convert the analog voltage that appears at the vertical signal line into a digital voltage value;
a first signal line that is connected to a gate of the reset transistor;
a second signal line that is connected to a gate of the transfer transistor; and
a drive circuit configured to:
output a reset pulse to the first signal line to cause the reset transistor to discharge the charge in the charge accumulation portion; and
output a transfer pulse to the second signal line to cause the transfer transistor to transfer the charge generated in the photoelectric conversion element to the charge accumulation portion, wherein
the transfer pulse is output to the second signal line successively at least two times subsequent to the output of the reset pulse to read pixel signals corresponding to at least two frames from each unit pixel of the plurality of unit pixels prior to a next reset pulse.

11. The radiation detector according to claim 10, wherein the scintillator includes one of a CsI(TI) scintillator, a GSO single crystal scintillator, or a plastic scintillator.

12. The radiation detector according to claim 10, wherein the scintillator has a columnar crystal structure.

13. The radiation detector according to claim 10, further comprising an optical waveguide between the scintillator and the photoelectric conversion element, wherein the optical waveguide is configured to guide light generated in the scintillator to the photoelectric conversion element.

14. The radiation detector according to claim 13, wherein the optical waveguide includes an optical fiber.

15. A radiation measurement system, comprising:
a photoelectric conversion element configured to convert an incident photon into charge;
a scintillator on a light receiving surface of the photoelectric conversion element;
a transfer transistor configured to transfer the charge generated in the photoelectric conversion element to a charge accumulation portion;
a reset transistor configured to discharge the charge in the charge accumulation portion;
an amplifier transistor configured to cause an analog voltage having a voltage value corresponding to an amount of the charge in the charge accumulation portion to appear at a vertical signal line;
a converter circuit that is connected to the vertical signal line, wherein the converter circuit is configured to convert the analog voltage that appears at the vertical signal line into a digital voltage value;
an output circuit configured to output the digital voltage value converted by the converter circuit as image data;
a first signal line that is connected to a gate of the reset transistor;
a second signal line that is connected to a gate of the transfer transistor; and
a drive circuit configured to:
output a reset pulse to the first signal line to cause the reset transistor to discharge the charge in the charge accumulation portion; and
output a transfer pulse to the second signal line to cause the transfer transistor to transfer the charge generated in the photoelectric conversion element to the charge accumulation portion, wherein
the transfer pulse is output to the second signal line successively at least two times subsequent to the output of the reset pulse to read the image data corresponding to at least two frames prior to a next reset pulse.

16. The radiation measurement system according to claim 15, further comprising an information processing device configured to analyze the image data output from the output circuit.

17. The radiation measurement system according to claim 15, further comprising a radiation source configured to emit radiation.

18. The radiation measurement system according to claim 17, wherein the radiation source is configured to emit at least one of an alpha ray, a beta ray, or a gamma ray.

19. The radiation measurement system according to claim 17, further comprising a radiation-source control device configured to control emitting of the radiation from the radiation source.

20. The radiation measurement system according to claim 15, wherein the radiation measurement system includes one of a survey meter or a transmission X-ray imaging apparatus.

* * * * *